United States Patent [19]

Cay et al.

[11] Patent Number: 4,806,057
[45] Date of Patent: Feb. 21, 1989

[54] AUTOMATIC WAFER LOADING METHOD AND APPARATUS

[75] Inventors: Norman S. Cay, Los Gatos; Gerald M. Bowers, Boonville, both of Calif.

[73] Assignee: Motion Manufacturing, Inc., Santa Clara, Calif.

[21] Appl. No.: 855,088

[22] Filed: Apr. 22, 1986

[51] Int. Cl.[4] .............................................. B65G 65/30
[52] U.S. Cl. .................................. 414/225; 198/346.1; 198/346.2; 294/103.1; 414/404; 414/416; 414/417; 414/433; 414/757; 414/786
[58] Field of Search ............... 414/416, 417, 403, 404, 414/222, 225, 226, 217, 741, 754, 757, 786, 433, 152; 901/37; 294/88, 103.1; 198/346.1, 346.2

[56] References Cited

U.S. PATENT DOCUMENTS

| | | | |
|---|---|---|---|
| 2,639,050 | 5/1953 | Hoffman, Jr. | 414/417 |
| 3,682,327 | 8/1972 | Winne | 414/741 |
| 3,841,689 | 10/1974 | Hurlbrink, III | 294/87.1 |
| 3,934,733 | 1/1976 | Worden | 414/405 |
| 3,949,891 | 4/1976 | Butler et al. | 414/405 |
| 3,982,627 | 9/1976 | Isohata | 414/757 |
| 3,991,619 | 11/1976 | Appleford et al. | 198/346.2 X |
| 4,208,159 | 6/1980 | Uehara et al. | 414/416 X |
| 4,244,673 | 1/1981 | Henderson | 414/405 |
| 4,299,532 | 11/1981 | Bouwmeester | 414/750 |
| 4,306,646 | 12/1981 | Magni | 198/346.1 X |
| 4,311,427 | 1/1982 | Coad et al. | 414/225 X |
| 4,368,913 | 1/1983 | Brockmann et al. | 901/37 X |
| 4,439,146 | 3/1984 | Sugita | 432/253 |
| 4,441,853 | 4/1984 | Kosugi | 414/757 |
| 4,457,661 | 7/1984 | Flint et al. | 414/417 X |
| 4,466,766 | 8/1984 | Geren et al. | 414/404 |
| 4,490,087 | 12/1984 | Ryan et al. | 414/417 |
| 4,493,606 | 1/1985 | Foulke et al. | 414/787 |
| 4,536,122 | 8/1985 | Herrmann et al. | 414/404 |
| 4,568,234 | 2/1986 | Lee et al. | 414/416 X |
| 4,573,851 | 3/1986 | Butler | 414/417 X |
| 4,611,966 | 9/1986 | Johnson | 414/404 |
| 4,645,401 | 2/1987 | Hopkins et al. | 414/416 X |
| 4,659,281 | 4/1987 | Aupperle | 198/346.2 X |
| 4,662,811 | 5/1987 | Hayden | 414/433 |

FOREIGN PATENT DOCUMENTS

| 182846 | 10/1983 | Japan | 414/417 |
|---|---|---|---|
| 252535 | 12/1985 | Japan | 414/416 |

OTHER PUBLICATIONS

Quartz International brochure entitled, "The Best Transfer System Just Got Better . . . ", undated.
Quartz International "CTS 5225 Mass Wafer Transfer" brochure.
Veeco Instruments Inc. brochure entitled, "Veeco's Flexible Automated Wafer Fab Systems", undated.
Bruce Systems pamphlet entitled "More Wafer Fab. Products From Bruce. Introducing The ELS Elevator Loading System", undated.
Unimation Incorporated (A Westinghouse Company) brochure entitled, "UNIMATE PUMA Series 700 Industrial Robots Models 761 and 762", undated.

Primary Examiner—Robert J. Spar
Assistant Examiner—David A. Rucci
Attorney, Agent, or Firm—Cushman, Darby & Cushman

[57] ABSTRACT

An automated diffusion furnace load station has a cassette and wafer transporter which selectively transports, using a support assembly, wafer-filled cassettes from a delivery station to a transfer post over which a loaded cassette is lowered to suspend the set of wafers above the cassette. The transporter causes the support assembly to release the cassette and engage the wafers to transfer them as a set to a carrier of a diffusion furnace tube. The process is reversed for unloading processed wafers from a furnace carrier and loading them into a cassette. The process further may be sequentially performed to exchange sets of processed wafers from a furnace carrier with sets of unprocessed wafers located in cassettes at a delivery station. The support assembly is used to selectively support a cassette or a set of wafers removed from a cassette by selectively positioning a pair of jaws relative to a cassette or to a set of wafers for supporting the same. Apparatus is also disclosed for aligning the flat edges of wafers in a cassette, and, selectively and sequentially raising individual wafers in the cassette to expose a margin of the wafers for optical scanning.

34 Claims, 4 Drawing Sheets

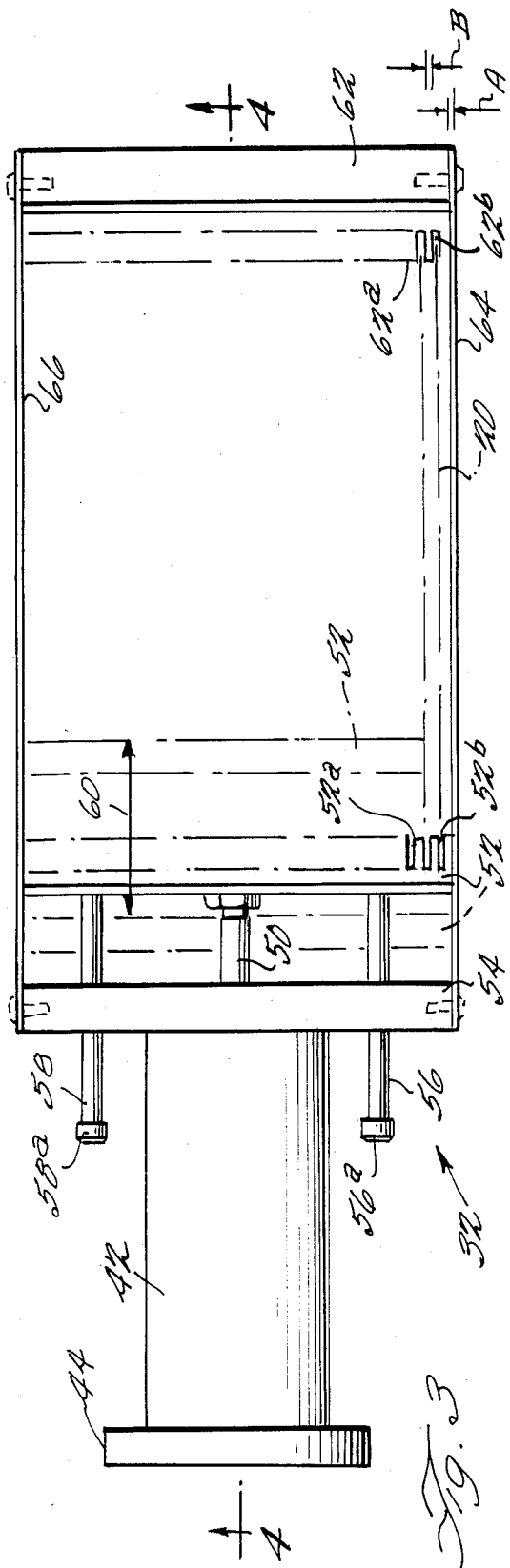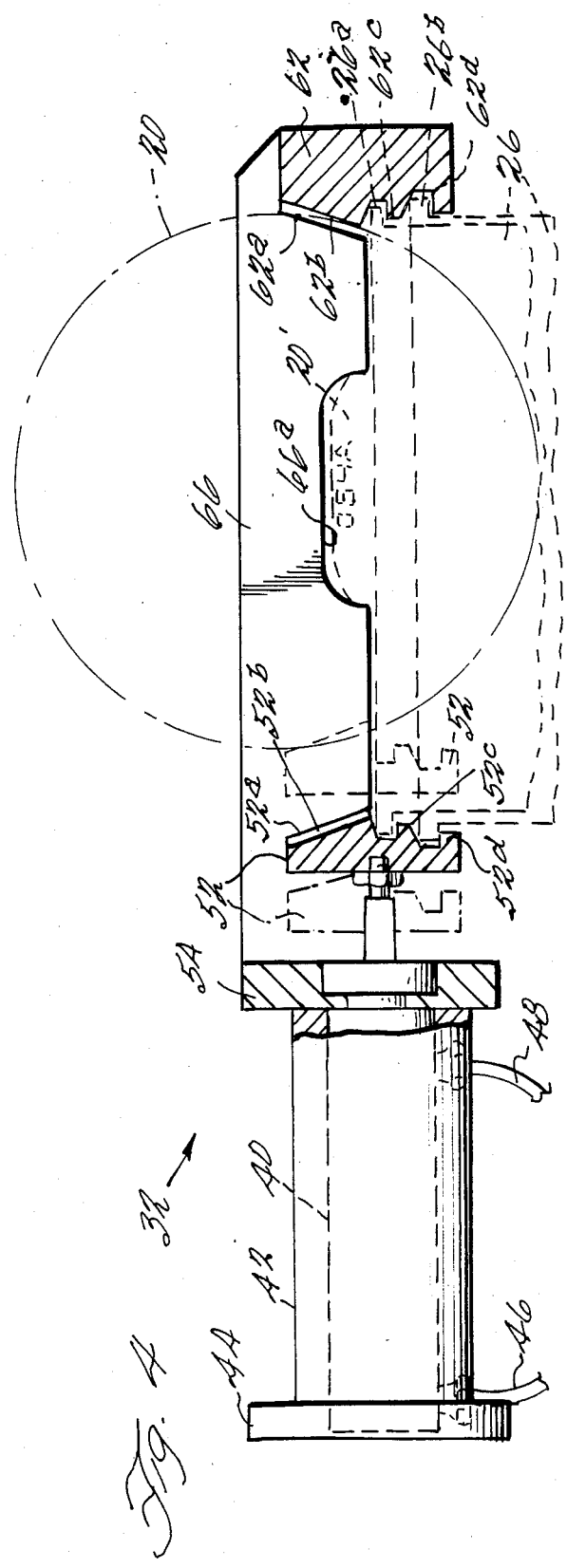

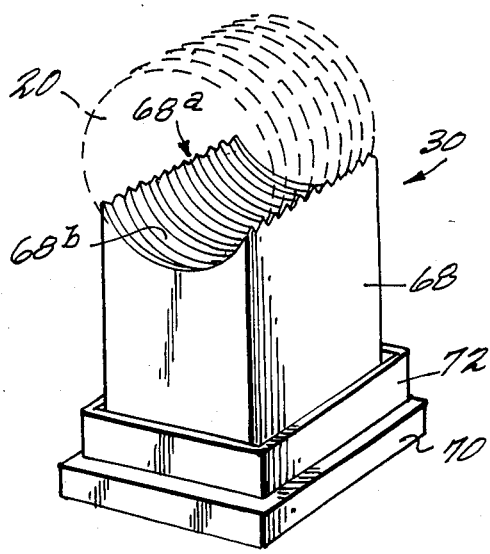
Fig. 5
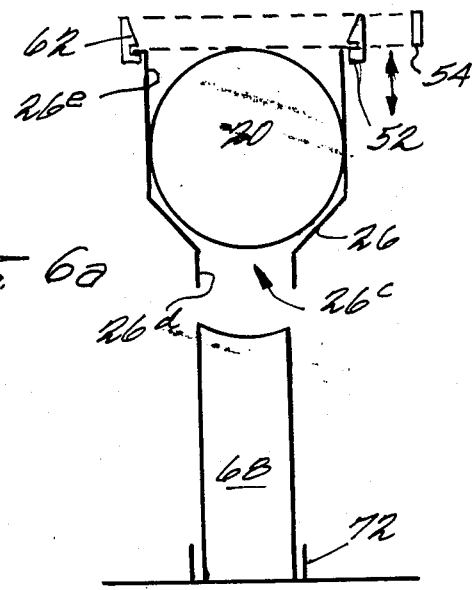
Fig. 6a
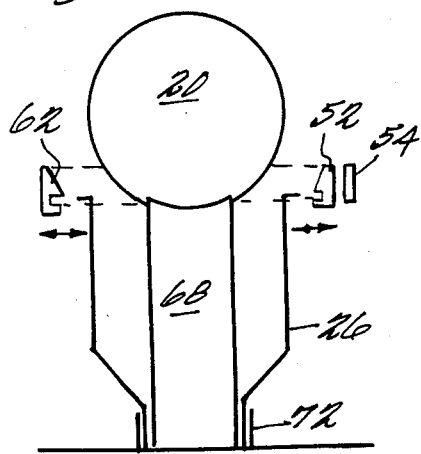
Fig. 6b
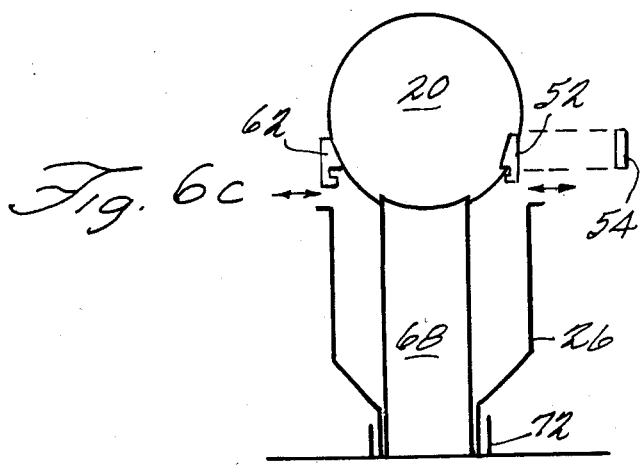
Fig. 6c
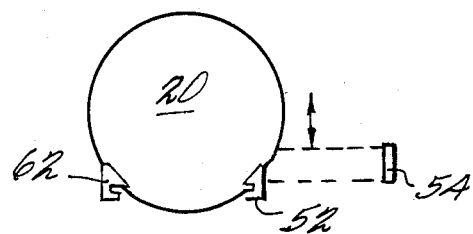
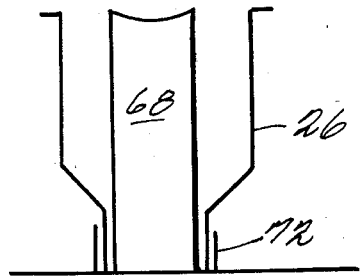
Fig. 6d

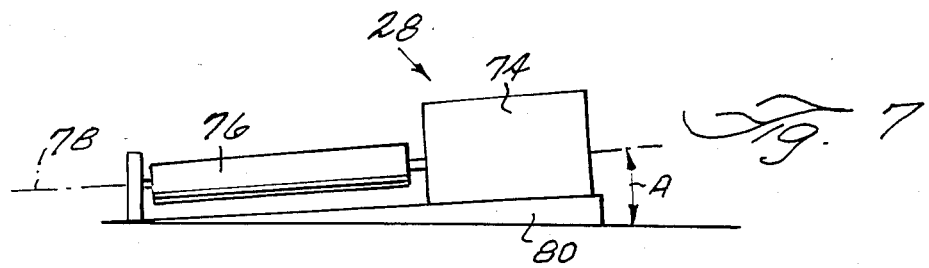
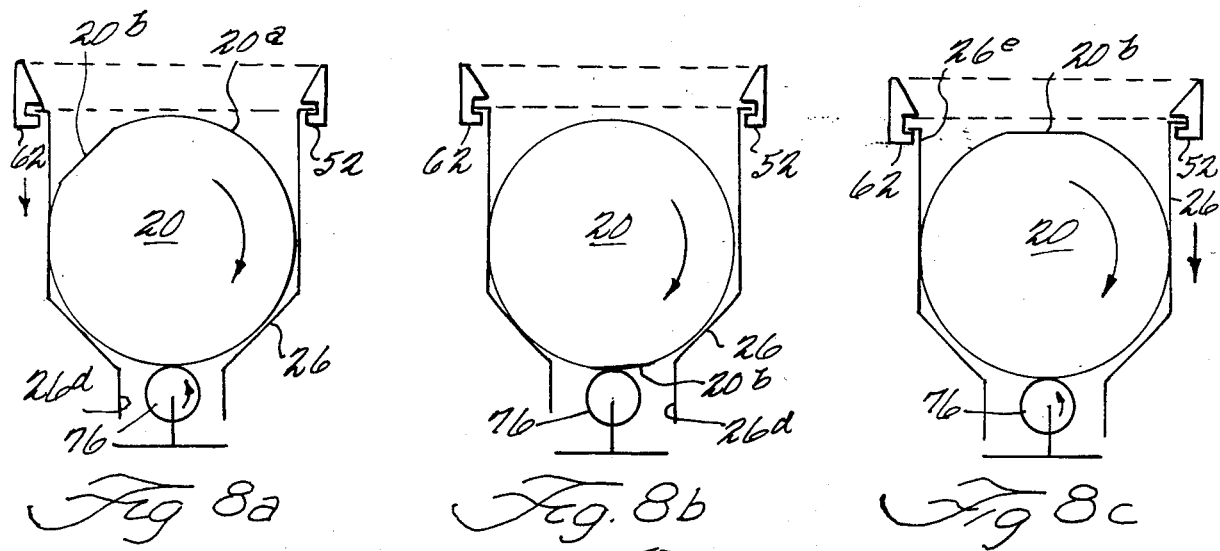
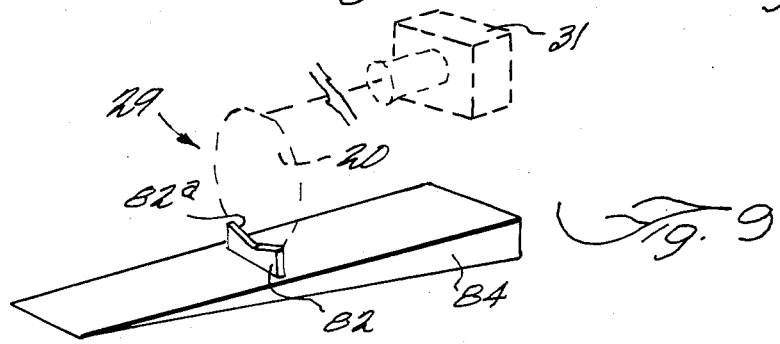
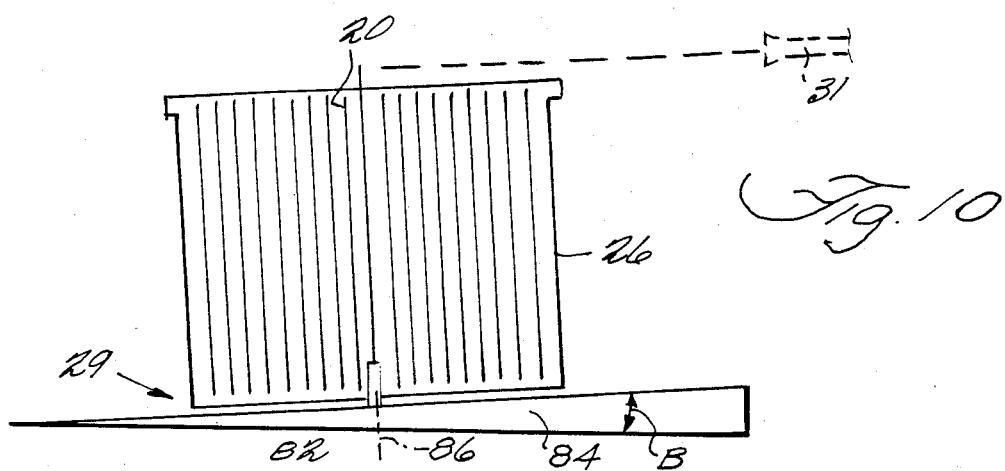

AUTOMATIC WAFER LOADING METHOD AND APPARATUS

BACKGROUND OF THE INVENTION

This invention relates to a semiconductor wafer loading method and apparatus. More particularly, it pertains to such a method and apparatus wherein a plurality of wafers are simultaneously transferred between a wafer transport container positioned at a delivery station and a process container disposed at a wafer-processing station.

The need for cleanliness during the manufacture of integrated circuits on semiconductor wafers is well-known. Airborne particles settle on the wafers and become integrated into the wafer through processing. This contamination of the wafer causes failure of integrated circuits manufactured on it. The continuing decrease in line circuit geometries has spurred a well publicized drive for improved cleanliness in all phases of wafer production. In terms of cleanliness, one of the most difficult items to deal with in the fabrication area is the presence of a human operator. Studies have put as many as fifty thousand particles per cubic foot (1.77 million particles per cubic meter) within one inch (2.5 cm) of an operator's skin. Any exposure of wafers to this level of contamination is certain to transfer particles to the wafer surface, resulting in substantially reduced integrated circuit yield, as discussed above.

Wafer handling for most processes involving treatment of wafers has been automated to the level of providing automated transfer of wafers one at a time out of a transport container or cassette to the process apparatus and back into a cassette at the end of the process. This reduces the need for operator handling but prolongs the treatment process due to the individual handling of the wafers. The wafers are kept under laminar flow hoods during loading and unloading operations. Processing is performed in clean chambers and exposure to an operator is minimized.

However, the handling of wafers for processing in diffusion furnaces has not followed this trend toward automation. Although the furnace, gas and time control systems are highly automated for the actual furnace operation, no practical arrangement for automatically providing cassette-to-process and back-to-cassette handling of wafers has heretofore been demonstrated. Most wafer fabrication systems use a combination of separate transfer machines in furnace loaders with a human operator exchanging the cassettes and furnace boats, which are wafer containers separable from a carrier which shifts the loaded boats in and out of the furnace. Some automated wafer handling systems exist for diffusion furnaces having separate transfer machines and furnace loaders using one or more custom-built robots to perform the movement of cassettes and boats. However, none of these machines operate continuously without human intervention. due to the fact that several machines are used to perform the various wafer-handling operations, the loading systems suffer from greatly increased complexity and a lowered mean time between machine (and therefore system) failure. Further, it is difficult to provide practical outward interface between the several machines and a host computer or a system for transfering wafers into and out of the handling system.

The systems now available also inherently require the use of intermediate containers or carriers. That is, wafers are removed from a cassette and put into an intermediate boat and the boat is then transferred onto a process container or carrier for actual processing. THe load stations thus tend to be fairly large and require movement of wafers outside of laminar flow environments.

SUMMARY OF THE INVENTION

The present invention provides an automated wafer loading and unloading method and apparatus which overcome many of the disadvantages of the presently known systems. In particular, the invention provides a system which is fully automated so that no human operation is required. Further, the loading station can be kept reasonably small and substantially simplified so that it can be entirely conducted under a laminar flow environment and does not use an intermediate carrier or boat to carry wafers to a process container positioned for direct use in the processing of wafers without additional handling.

These advantages are realized in the present invention which provides for transferring a plurality of wafers between a transport container at a delivery station and a process container at a wafer-processing station. A wafer-filled container is supported and transported from a delivery station to an unloading station. The plurality of wafers are removed from the transport container, supported as a group, and transported together to a processing station. At the processing station they are loaded directly into a process container positioned for direct insertion into a diffusion furnace or similar wafer processing apparatus. Further,t the reverse process may be performed to unload processed wafers from the process container, to transport them to and load them into a transport container, and to transfer them to a delivery station for removal.

This system is also operable to remove a plurality of sets of processed wafers from the process container, one set at a time and replacing 3each set with a set of unprocessed wafers so that an exchange is effected. Processed wafers are loaded in an empty cassette and the cassette is placed at the delivery station. A cassette of unprocessed wafers is then picked up and the wafers removed. The removed wafers are positioned in the process container where the previously-positioned processed wafers had been located. In this way a continuous cycle loading an d unloading process can be performed.

It is often desirable to orient the flat edge of wafers in a particular orientation, normally upward, in order to provide additional head room and improve diffusion of gases in a furnace, as well as to provide a uniform circular edge at the bottom of the wafers for placement on boats and process containers. Another salient feature of the present invention thus, may also include means for rotating the wafers relative to which the transport container is positioned. The transport container may be positioned in a two-stage procedure for aligning the flat edges of wafers in a predetermined position, such as upwardly. It is also desirable to scan identification characters normally imprinted on the face of wafers adjacent the flat edge. In order t o accommodate this, the present invention also includes apparatus, and a method of using the apparatus, for selectively moving a single wafer out of the transport container sufficiently to expose the portion of the face of the wafer having the imprinted characters, thereby putting them in view of a scanning camera.

These and additional objects and advantages of the present invention will be more clearly understood from a consideration of the drawings and the following detailed description of the preferred embodiment.

BRIEF DESCRIPTION OF THE DRAWINGS

With reference to the accompanying three sheets of drawings:

FIG. 3 is a plan view of a support assembly used for carrying, selectively, cassettes and wafers;

FIG. 4 is a cross-sectional view of the support assembly of FIG. 3 taken along line 4—4;

FIG. 5 is a side perspective view of a passive transfer post assembly used for unloading and loading cassettes;

FIGS. 6a–6d show, schematically, various steps involved in unloading wafers from (or loading wafers into) a transport container using the transfer post assembly of FIG. 5;

FIG. 7 is a side elevation of a roller or "flat finder" illustrated in FIG. 1;

FIGS. 8a–8c are schematic end views of the roller and a wafer-containing cassette showing various steps involved in orienting the flat edge of a wafer contained in a cassette in a predetermined position;

FIG. 9 is a side perspective view of an apparatus for raising individual wafers form a cassette for scanning by a camera; and FIG. 10 is a simplified side view of the apparatus of FIG. 9 showing manipulation of a wafer in a cassette.

DETAILED DESCRIPTION OF THE PREFERRED EMBODIMENT

Figure 1:
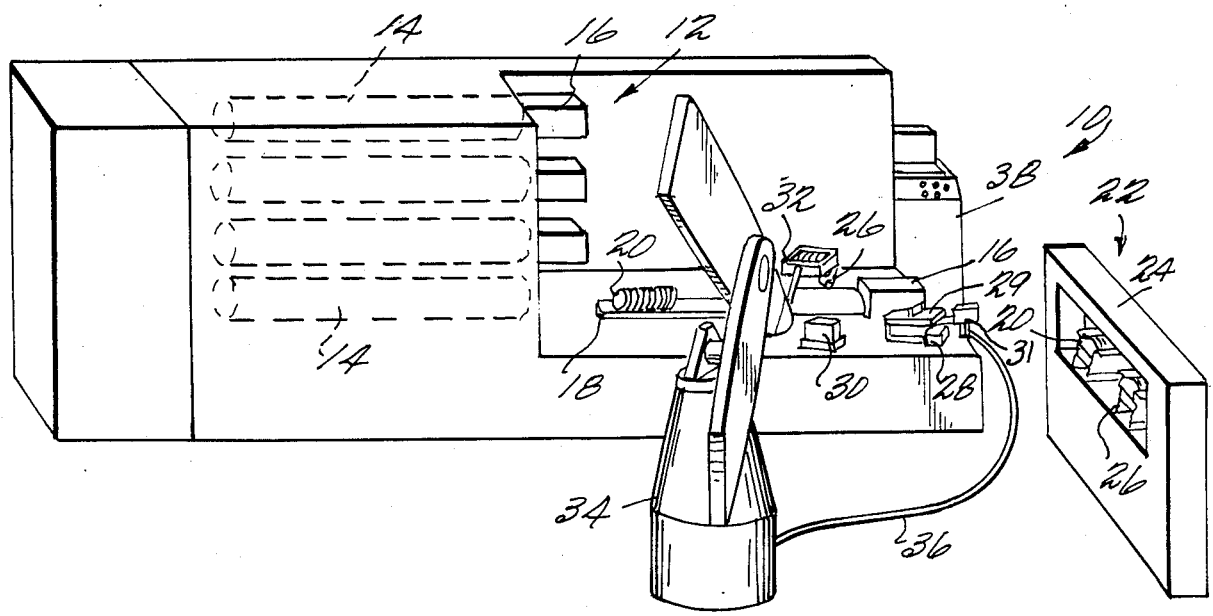
FIG. 1 is a perspective view of an automated diffusion furnace load station made according to the present invention.
Figure 2:
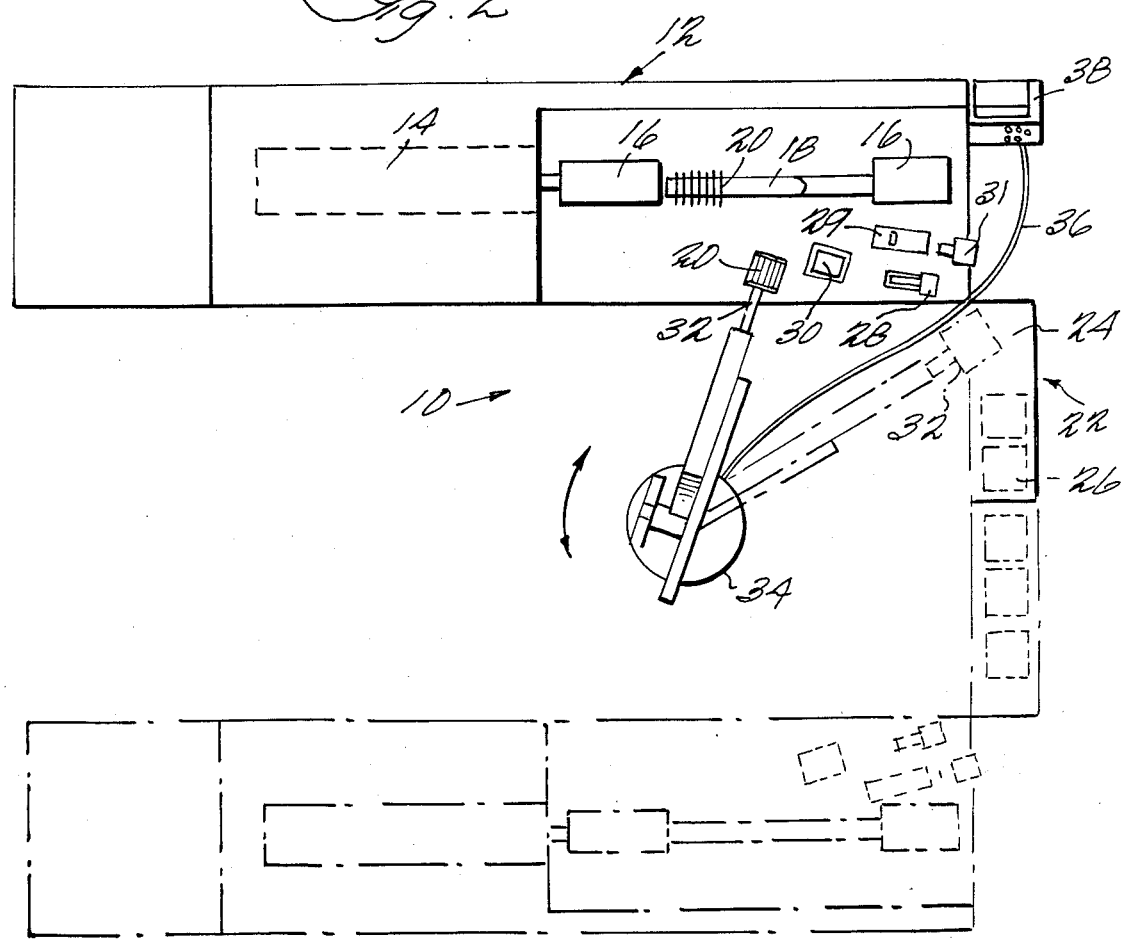
FIG. 2 is a plan view of the loading station of FIG. 1 also showing a second load station which may be served by a single wafer handler.

Referring initially to FIGS. 1 and 2, a preferred embodiment of an automated diffusion furnace load station according to the invention i s shown generally at 10 associated with a diffusion furnace 12. Furnace 12 includes four furnace tubes 14 shown in dashed outline and a furnace loader 16 associated with each furnace tube, each of which loaders includes w wafer process paddle or carrier 18. The lowest of the four loaders is shown in a position for loading and unloading wafers. The upper three loaders are shown in positions during processing of the wafers in the tubes. Several semiconductor wafers 20 are shown supported on carrier 18. These wafers may have already been processed in tube 14 or may be unprocessed wafers which are to be inserted into tube 14 for processing. WAfers 20 may be either supported directly on a carrier 18, as shown, or the wafers may be placed on a separate wafer boat which is disposed on carrier 18. However, such a boat is not needed in the preferred embodiment so long as the carrier is constructed to directly hold the wafers. It will be understood that a laminar flow hood is conventionally installed above loaders 16 so that the air may be kept substantially particle free during the loading and unloading of wafers as contemplated by the present invention.

Furnace load station 10 includes a delivery station 22 which includes, preferably, a laminar flow cabinet 24 containing an internal chamber which is maintained under a laminar flow and which has an opening on opposite sides for receipt of wafer-containing transport containers or cassettes 26.

The load station shown also includes a flat finer 28. As will be described with reference to FIGS. 7, 8, this includes a roller over which a wafer-filled cassette may be placed for rotating the wafers within the cassette. Each wafer has a primary flat edge portion which, when rotated into position adjacent the roller, moves out of contact with the roller and prevents the wafer from continuing to be rotated. The wafers may then be rotated further until the flat edges are in a desired position.

It is often desirable to identify the wafers being processed by applying optically readable characters along one face of the wafers adjacent the flat edge. In order to read these characters most easily each wafer is elevated after the flat edges have been positioned upwardly. This is provided by a cassette pusher 29, as will be described in further detail with reference to FIGS. 9,10, which is associated with a camera 31 used to optically read the exposed characters.

Load station 10 further includes unloading and loading means for unloading a plurality of wafers from a cassette and, conversely, for loading a plurality of wafers into a cassette. This is provided by a transfer post 30 which will be described shortly with reference to FIG. 5.

Means are also included for supporting a cassette and means for supporting a set of wafers unloaded from a cassette. In this preferred embodiment, these supporting means is provided by a, support assembly 32. Transport means are coupled to support assembly 32 for transporting controllably the support assembly between delivery station 22, flat finder 28, wafer pusher 29, transfer post 30, and furnace 12. this is provided by a mechanical robot 34 which has an arm coupled to assembly 32. Control means is also provided which is coupled to the transport means for causing the support assembly to carry a wafer-filled cassette between the delivery station and the transfer post and to carry a plurality of wafers removed from the cassette between the transfer post and the carrier at the furnace. This is provided by a computer 38 which is connected by a cable 36 to mechanical robot 34.

The robot, cable and computer are commercially available as an industrial robot, such as a robot manufactured by Unimation Incorporated under the trademark name UNIMATE PUMA Series 700 Industrial Robot, Model 761. Such robots are self-programming to the extent that the robot arm to which support assembly 32 is attached may be moved into different desired positions during the processing and by identifying those positions using apparatus provided by the maker of the robot, the robot can be made to follow a particular movement sequence corresponding to the positions and order established for any particular application.

A second furnace may be associated with furnace load station 10, as shown in phantom lines in FIG. 2, so that the number of tubes serviced by load station 10 is doubled from four to eight, depending on the particular furnace being loaded and unloaded. It is also possible to provide a separate shelf for separate flat finders, wafer pushers, and transfer posts for each tube if it is desired to assure there is no cross contamination between the wafers in the separate furnace tubes.

Referring now to FIGS. 3, 4, support assembly 32 is shown in further detail. Assembly 32 includes a gas-pressure valve shown in phantom lines at 40 contained within a mounting sleeve 42. Sleeve 42 includes a flange 44 which is connected to an arm of robot 34. Valve 40 is connected to gas lines 46, 48, which in the preferred embodiment, provide a negative pressure or vacuum to valve 40. In this way any particles generated by valve 40 tend to be pulled into the valve, thereby reducing the particulate contamination caused by its operation.

Valve 40 operates a arm 50 which is moved from left to right in the figures depending on operation of the valve. The external end of ram 50 is fixedly connected to an inner jaw 52 so that it moves with ram 50. Fixedly attached to the right end of sleeve 42 is a base plate 54. This plate limits the movement of jaw 52 to the left. Jaw 52 also has attached to it a pair of motion-limiting rods 56, 58 which extend to the left through corresponding openings in plate 54 and terminates at knobs 56a, 58a, respectively. Knobs 56a, 58a limit the extend that rod 50 and jaw 52 may be extended to the right in the figures by contacting plate 54. The extremes of travel of jaw 52 are shown by the phantom images of the distance of which is illustrated by double ended arrow 60.

At the right end of assembly 32, as shown in the figures, is a second jaw 62 which has the same width as base plate 54. Jaw 62 is fixed in position relative to plate 54 and is connected therewith by a pair of mounting plates 64, 66 which have a thickness A. The mounting plates are thus fixed in position relative to the arm of robot 34 to which assembly 32 is attached. Jaws 62 and 52 are moved relative to each other by movment of jaw 52.

Disposed on jaws 52, 62 is an upwardly and inwardly facing surface 52a, 62a, respectively, each having grooves 52b, 62b, respectively, which are each sized to receive a wafer, such as wafer 20 shown in dot-dashed lines in FIG. 4.

The end outline of the top of a cassette 26 is also shown in FIG. 4. It will be noted that at each opposite upper side edge there is a ledge, such as ledge 26a. Disposed at the lower edge of each jaw 52, 62, is a flange 52c, 62c, which extends inwardly as shown. When the jaws are in the relative positions shown in solid lines, ledges 26a are disposed over the jaw flanges so that the cassette may be lifted vertically and be supported by the flanges.

Wafers have an undeveloped side, on which are imprinted the optically readable characters adjacent the flat edge, and an opposite side on which integrated circuits are formed. All the wafers in a cassette are oriented in the same direction. Further, the wafers must have a specific orientation in the furnace for proper processing control, and must be oriented properly when raised on wafer pusher 29 so that the characters will be facing the camera.

It is thus necessary that system 10 be able to properly orient the cassettes. To this end, the cassettes have additional ledges on their ends, such as ledge 26b, shown in phantom in FIG. 4 which, on the cassettes used by this embodiment, are thicker than ledge 26a described previously. There therefore is provided a lower flange 52d, 62d, in jaws 52, 62, with larger openings above the flanges to provide receipt to these end ledges. This permits cassette 26 to be picked up either form the side or form the ends. This is shown by the two cassettes in dashed outline in FIG. 4. The upper cassette 26 is shown as an end view with the side ledges being grasped, and the lower cassette is shown as a side view with the end ledges being grasped.

In this preferred embodiment, the end ledges of cassettes 26 are grasped by the jaws at delivery station 22. The cassette is then rotated 45°, in a direction appropriate for the particular side of furnace tubes being serviced, before being placed on the counter near stand 30. The jaws are then rotated by robot 34 90° to grasp the cassette from the sides with the wafers being in the appropriate orientation. Thus, both furnace tube sets may be serviced from a single delivery station 22 without requiring special handling of the cassettes when they are delivered.

It will also be seen that when jaw 52 is disposed furthest away from jaw 62, the jaws can vertically pass the cassette ledges. The jaws are thereby allowed to be inserted over the cassette and shifted into the position shown for engaging the cassette. When the jaws are shifted into the narrow position they will support wafers directly.

Grooves 52b, 62b, are separated from adjacent grooves by a distance B. It will be seen that the thickness A of plates 64, 66 is sufficiently less than the distance between the grooves that the plates will fit into the space between wafers without contacting the wafers. Plates 64, 66 have cut-outs, such as cut-out 66a shown in FIG. 4, which provide for viewing of the characters imprinted on the faces of the wafers as shown by wafer 20' shown in a raised position in phantom lines.

Referring now to FIG. 5, the transfer post 30 is shown in further detail. It is simply a stand 68 which extends upwardly above a table 70 on which it is mounted and has a cassette frame or landing 72. This landing is a vertical fence which extends around stand 68 and is spaced just far enough from the stand to freely receive a cassette therebetween. Stand 68 has an upper surface 68a which includes a plurality of grooves 68b having a one to one correspondence with the grooves and jaws 52, 62 of support assembly 32, all of which has groove spacings corresponding with those of a cassette 26, not shown, which are each wider than the wafers are thick to accommodate the wafers without unnecessary abrasion. Each cassette has a passageway 26c extending upwardly through it. At the bottom of passageway 26c is a first opening 26d sized large enough to freely receive stand 68 but small enough to retain the wafers in the cassette. At the upper end of passageway 26c is a top or second opening 26e sized large enough to freely receive the wafers during loading an d unloading of the cassette.

During a typical exchange procedure, processed wafers are removed from a carrier 18 and replaced with unprocessed wafers from a cassette 26 at a delivery station 22. Robot 34 under the control of computer 38 places an empty cassette over stand 68 so that it is received on landing 72. As part of an on-going operation, however, an empty cassette 26 would already be disposed on landing 72, having been left from a previous furnace tube loading operation. Once a set of processed wafers 20 are removed from a furnace tube 14, robot 34 moves support assembly over above the first set wafers corresponding to the number of wafers which may be held by a cassette. In the preferred embodiment this is equal to twenty-five wafers. Jaws 52, 62 are spread apart so that they may pass down below the middle of wafers 20 without contacting them. THe jaws are then brought together into what is also referred to herein as a second position, shown as the closer position of the jaws in FIG. 4, and then support assembly 32 is raised with the grooves and the jaws aligning with the wafers, so that they are supported. The wafers a re then lifted off of carrier 18 and transported over onto stand 68 to the position shown in FIG. 6d. The jaws are lowered in alignment with the stand so that wafers nest in the grooves on stand 68 (as shown in FIG. 6c) and are removed from the jaws. When the wafers are no longer supported by the jaws, the jaws may be separated further so that they can pass down to the extending ledges of the empty cassette 26 disposed below the stand (as shown in FIG. 6d). The jaws then move inwardly toward each other until the flanges of the jaws engage the ledge so the cassette as described previously. This position of the jaws is also referred to as a firsts position. The cassette is then raised vertically so that it engages wafers 20 and removes them from stand 68 (as shown by FIG. 6a). The cassette filled with processed wafers is then delivered to an empty position at delivery station 22.

A cassette filled with unprocessed wafers is raised and removed from delivery station 22 and processed on flat finer 28 and pusher 29 as will be described shortly. The cassette is then raised and moved into position as shown in FIG. 6a. Following the reverse of the process previously described, the cassette is positioned over stand 68 so that it may slide down around the stand and into landing 72, as shown in FIG. 6b. It can be seen that as this is done wafers 20 are captured on stand 68 and held in its grooves as the cassette is lowered to a position below the wafers, as shown, with the stand extending through passageway 26c. The jaws are then spread apart to release the cassette and are raised slightly to be in a position adjacent the lower edges of the wafers. The jaws are then shifted into the closer position, as shown in FIG. 6c and raised until they contact the set of wafers supported on stand 68. By continued raising of the jaws, the wafers a re removed, as a set, from the stand, as shown in FIG. 6d.

They are then transferred over to the location of the carrier 18 where the previous set of processed wafers was just removed. They are lowered into position for support on the carrier, as were the previous processed wafers. The jaws are then separated and raised above the wafers and shifted over to a position of a new set of processed wafers for repeating of this process.

It will be appreciated that when several sets of wafers are disposed on the carrier, it is important that the jaws be positionable about adjacent wafers without disturbing the wafers. Thus it is important that the mounting plates 64, 66 connecting jaw 62 to base plate 54 be thin enough to fit between adjacent wafers without contacting them. The process is thus continued until all of the processed wafers a re removed from carrier 18 and replaced by unprocessed wafers from delivery station 22. The processed wafers in cassettes at the delivery station may then be removed by a conventional external device or operator. Mechanized systems presently exist for automating the transfer of cassettes between processing stations so that it is possible to now provide a substantially fully automated wafer transfer system.

Referring now to FIG. 7, a side view of flat finder 28 is shown. It includes a preferably brushless DC induction motor 74, of conventional construction for flat finder operation, drivingly connected to an elongate roller 76 which rotates about an axis 78. Roller 76 is mounted relative to a base 80 so that it is transverse to a horizontal plane at an angle A, preferably of approximately 3° to 5°.

Referring now to FIGS. 8a-8c, the use of flat finder 28 is discussed. Each wafer 20 includes a generally circular edge portion, shown at 20a in the figures, which normally comprises most of the edge of the. Wafers also include one or more recessed edge portions, but universally will include one longer or primary flat edge portion, such as flat edge portion 20b. Initially, cassette 26 is positioned above roller 76. The cassette, supported in jaws 52, 62, is lowered to a second position in which the roller just contacts the circular edge portion 20a of the wafer, as shown. The roller is then rotated, as shown in FIG. 8b, until flat edge portion 20b of each wafer rotates into position adjacent the roller. In t his second position, the roller has not displaced the wafers enough to contact the wafer along the entire flat edge portion. There is thus developed, a separation between the flat edge portion and the roller, such as shown by the exaggerated spacing in the figure. Thus, all of the wafers in the cassette are rotated to the position shown in FIG. 8b.

When wafer 20 reaches the orientation shown in FIG. 8b, roller 76 preferably is stopped. Cassette 26 is then lowered into a third position with respect to flat finder 28, in which the roller contacts wafer 20, and actually supports the wafer, sufficiently so that the entire wafer edge, including flat edge portion 20b, is contacted by the roller. The roller is then rotated, as shown in FIG. 8c, preferably until recessed edge portion 20b is directly on top facing out of cassette opening 26e. Roller 76 is preferably stopped once the wafer reaches this position. Cassette 26 is then moved away from roller 76, the aligning process having been completed.

As can be seen in FIG. 7, and as discussed previously, roller 76 is actually inclined at an angle A relative to the horizontal. If viewed from the side, cassette 26 would also preferably have the same angle. The purpose for this angulation is to cause all of the wafers to lean, under the force of gravity, against a common side of the cassette grooves in which they are held. The wafers, thus, tend to be maintained at a consistent and controlled spacing apart from adjacent wafers, so that there is reduced likelihood of contact between the wafers during rotation. Contact between the wafers and the cassette is also limited, predominantly, to one side of the wafers. The wafers thus tend to shift around in the grooves of the cassette less.

It will be appreciated that roller 76 does not need to be disposed at an angle. The wafers will rotate if cassette 26 is positioned at an angle to the roller. However, by orienting the roller generally normal to the wafers, the wafers are supported directly on their edges and there is better traction for rotating them.

It will be noted from the previous discussion, that the roller is turned off after the flat portions were located adjacent first opening 26d of the cassette and then turned on again after contact is re-established between the roller and the wafers. The roller is finally turned off once the flat edge portions are positioned at the top of the cassette. The reason for stopping the motor until the wafers a re moved into position against, or away from, the roller, is that all wafers do not necessarily have identical dimensions and may not ride identically within the cassette. Thus, if the roller is turning as it contacts the wafers, some wafers are contacted before others, thereby causing them to be rotated a different amount than the others. This results in the flat edge portions becoming misaligned. By controlling the stopping and starting of the roller, the full set of wafers can be rotated with the flat edge portion staying substantially in alignment, so long as the wafers are of fairly uniform diameter.

Referring now to FIGS. 9, 10, wafer pusher 29 includes an upstanding pedestal 82 which is then enough to contact only a single wafer when a waferfilled cassette 26, as shown in FIG. 10, is lowered relative to the pedestal. Pedestal 82 is mounted on a wedge-shaped platform 84 having an upper surface disposed at an angle B of approximately 3° to 5° from the horizontal, as shown particularly in FIG. 10. Correspondingly, pedestal 82 is disposed in a plane 86 which is transverse from a vertical plane by angle B. As shown in FIG. 9, pedestal 82 has an upwardly facing surface 82a which is in the shape of a very wide V for accommodating the bottom edge of a wafer 20.

In operation, a wafer-filled cassette 26, after the flat edge portions have been aligned at the top of the cassette, is positioned so that wafers 20 disposed in the cassette are essentially parallel with plane 86. The cassette is then lowered down toward platform 84, preferably without contacting it, so that pedestal 82 extends upwardly through opening 26d into passageway 26c. The cassette continues to be lowered toward the platform so that one selected wafer is supported on pedestal surface 82a. The supported wafer rises above the other wafers contained in cassette 26, and above any interfering portions of cassette 26 so that camera 31 can visually scan the characters located on the face of the wafer adjacent flat edge portion 20b, as shown in the phantom wafer 20' viewed through cutout 66a of FIG. 4. By sequentially raising, repositioning, and lowering cassette 26 relative to pedestal 82, each of the wafers contained in the cassette can be elevated to a position where the characters can be scanned by camera 31, thereby permitting an automatic inventory of the cassettes being processed. Once all the wafers have been scanned, the cassette is moved over to stand 30 where the wafers are removed for processing, as described previously, with reference to FIG. 6a-6d.

If processing of the wafers is not standardized for all operations, sensors may be added to provide input into computer 38 when unprocessed wafers are received in particular locations in delivery station 22 and to which furnace tubes those cassettes are to be processed. Communication may also exist with an external computer to control inventory and processing. Further, delivery station 22 can be substantially enlarged to provide an array of cassette positions to provide for complete loading and unloading of all furnace tubes without having cassettes exchanged externally during the processing.

If can be seen that the passive transfer post of the preferred embodiment allows a single robot and support assembly to accomplish the entire wafer unloading and loading process without having a separate transfer apparatus or container, such as an intermediate carrier or boat. This system certainly could be modified to incorporate such intermediate transfer systems to provide for removal of wafers from a cassette and placement in a boat. However, as is well understood in the trade, the less the wafers are handled, the fewer airborne contaminants will be produced.

Thus, while the invention has been particularly shown and described with reference to the foregoing preferred embodiment, it will be understood by those skilled in the art that other changes in form and detail may be made therein without departing from the spirit and scope of the invention as defined in the claims.

What we claimed is:

1. A system for unloading a set of a plurality of semiconductor wafers from a transport container containing a set of a plurality of mutually spaced, separately supported wafers, comprising:
   container and wafer supporting means positionable relative to a transport container containing a set of a plurality of wafers for supporting the transport container and positionable relative to a set of wafers unloaded from a transport container for supporting the unloaded set of wafers in mutually spaced relationship and independent of a container, said container and wafer supporting means having both container-engaging and waferengaging portions separate from one another for separately supporting a transport container and a set of wafers;
   unloading means for unloading simultaneously a plurality of wafers from a transport container while maintaining the wafers as a set in mutually spaced relationship and independent of a container;
   transport means coupled to said supporting means for transporting controllably said supporting means to said unloading means; and
   control means coupled to said transport means for causing said supporting means to support and transport a transport container containing such set of wafers to said unloading means for unloading said wafers.

2. The system of claim 1 wherein said unloading means further is for loading simultaneously a plurality of wafers into a transport container and said control means is further for causing said container and wafer supporting means to support simultaneously a plurality of mutually spaced wafers as a set and transport the set of wafers to said unloading means and for causing said container and wafer supporting means to support and transport away from said unloading means a container filled with the set of wafers.

3. The system of claim 2 wherein said unloading means further is for holding wafers removed from a transport container in a position such that the wafers are supportable by said supporting means.

4. The system of claim 1 wherein said supporting means include a pair of spaced-apart, facing jaws selectively adjustable with respect to one another to vary the distance between said jaws to permit positioning said jaws relative to a transport container without engaging the transport container and for adjusting said jaws for engaging the transport container.

5. The system of claim 1 wherein said container and wafer supporting means include a pair of spaced-apart, facing jaws having said container-engaging portions positionable in a first relative position for supporting a transport container and said wafer-engaging portions positionable in a second relative position for supporting simultaneously a plurality of mutually spaced wafers as a set directly on said jaws without a transport container.

6. The system of claim 5 wherein said jaws are adapted to be used with a transport container having a pair of ledges, each ledge extending from a side of the container opposite from the other ledge and each of said jaws includes a flange insertable under the ledges when positioned in said first position for vertically supporting the container.

7. The system of claim 5 wherein said unloading means holds wafers unloaded from a transport container in generally vertically disposed planes spaced a predetermined distance apart, and wherein each jaw includes grooves facing generally upwardly and toward the other jaw and spaced apart at intervals corresponding to the spacing apart at intervals corresponding to the spacing of wafers unloaded from a transport container held by said unloading means so that wafers supported by said jaws are received in said grooves.

8. The system of claim 5 wherein unloaded wafers are supported a predetermined distance apart on said unloading means and said wafer supporting means further includes a generally vertically disposed mounting plate coupled to said transport means and fixedly attached to one of said jaws for supporting said one jaw, with the thickness of said mounting plate being sufficiently thin to fit between adjacent unloaded wafers supported on said unloading means without contacting the wafers.

9. The system of claim 1 designed to be used with a transport container having a passageway extending vertically through it of a predetermined size and with substantially planar wafers having a generally circular edge, and wherein said unloading means includes a stand sized to be freely received in the transport container passageway and having an upwardly facing surface with grooves corresponding to the positions of wafers carried in a transport container and with opposite inwardly acing surface portions conforming generally with the curvature of the edges of the wafers supported in said grooves for maintaining wafers supported in said grooves in a fixed position along said grooves, said stand further having a transport container landing disposed at the base of said stand for receiving a transport container, said surface of said stand being disposed above said landing sufficiently to hold wafers unloaded from a transport container lowered toward said landing with at least a portion of the downwardly facing edge of each wafer exposed.

10. The system of claim 9 wherein said control means causes said transport means to lower said supporting means so that wafers held in a transport container supported by said supporting means are each in alignment with a corresponding one of said upwardly facing grooves of said stand as said transport container is lowered toward said landing.

11. A system for transferring a plurality of sets of semiconductor wafers, each set being a plurality of generally planar wafers capable of being held mutually spaced from, and generally parallel to, one another in a transport container delivered to a delivery station, between the delivery station and a process container capable of holding a plurality of sets of wafers, which process container is disposed at a wafer processing station, said system comprising;

container and wafer supporting means controllably positionable relative to a wafer-containing transport container for supporting the transport container and controllably positionable relative to a set of wafers removed from a transport container for supporting the set of wafers independent of a container, said container and wafer supporting means having both container-engaging and wafer-engaging portions separate from one another for separately supporting a transport container and a set of wafers;

unloading means for unloading simultaneously a plurality of wafers as a set from a transport container while maintaining the wafers in mutually spaced, generally parallel orientation independent of the container;

transport means coupled to said supporting means for transporting controllably said supporting means between the delivery station, said unloading means and the processing station; and control means coupled to said transport means for transferring sequentially a plurality of sets of wafers, with the plurality of wafers in each set being transferred simultaneously, from the delivery station to the processing station by, repeatedly, causing said supporting means to carry a wafer-containing transport container from the delivery station to said unloading means for unloading the set of wafers and causing said supporting means to carry the set of unloaded wafers to an empty portion of the process container for holding during processing.

12. The system of claim 11 wherein said container and wafer supporting means include a pair of spaced-apart, facing jaws selectively adjustable with respect to one another to vary the distance between said jaws to permit positioning said jaws relative to a transport container without engaging the transport container and for adjusting said jaws for engaging the transport container.

13. The system of claim 12 wherein said jaws have said container-engaging portions positionable in a first relative position for supporting a transport container and said waferengaging portions positionable in a second relative position for supporting simultaneously a plurality of mutually spaced and generally parallel wafers as a set directly on said jaws.

14. The system of claim 13 wherein said jaws are adapted to be used with a transport container having a pair of ledges, each ledge extending from a side of the container opposite from the other ledge, and each of said jaws includes a flange insertable under the ledges when positioned in said first position for supporting the container vertically.

15. The system of claim 13 wherein said unloading means holds wafers unloaded from a transport container in generally vertically disposed planes spaced a predetermined distance apart, and wherein each jaw includes grooves facing generally upwardly and toward the other jaw and spaced a part at intervals corresponding to the predetermined spacing of wafers unloaded from a transport container held by said unloading means so that wafers supported by said jaws are received in said grooves.

16. The system of claim 13 wherein said container and wafer supporting means further include a generally vertically disposed mounting plate coupled to said transport means and fixedly attached to one of said jaws for supporting said one jaw, with the thickness of said mounting plate being sufficiently thin to fit between adjacent wafers supported on the process container without contacting the wafers.

17. The system of claim 1 usable with a transport container having a passageway extending upwardly through it of a predetermined size, wherein said unloading means includes a stand sized to be freely received in the passageway and having an upwardly facing surface with grooves corresponding to the positions of wafers carried in a transport container and a transport container landing disposed at the base of said stand for receiving a transport container, said surface of said stand being disposed above said landing sufficiently to hold wafers unloaded from a transport container lowered toward said landing so that said supporting means can be positioned for supporting wafers held on said stand.

18. The system of claim 17 wherein said control means causes said transport means to lower said supporting means so that wafers held in a transport container supported by said supporting means are each in alignment with a corresponding one of said upwardly facing grooves of said stand as said transport container is lowered toward said landing.

19. The system of claim 18 wherein said control means causes said transport means to raise said supporting means above said stand while supporting an unloaded transport container to load wafers held on said stand into the transport container.

20. A system for transferring simultaneously a plurality of semiconductor wafers as a set between a process container at a wafer-processing station and a transport container spaced from the process container,
 container and wafer supporting means positionable relative to a set of a plurality of wafers unloaded from a transport container for supporting the wafers in a mutually spaced, generally parallel relationship to one another in a set, and positionable relative to a transport container containing a plurality of wafers for supporting the transport container and positioning it at said unloading means for unloading simultaneously the plurality of wafers as a set, said container and wafer supporting means having both containerengaging and wafer-engaging portions separate from one another for separately supporting a transport container and a st of wafers;
 unloading means for unloading simultaneously a plurality of wafers form a transport container while maintaining the wafers as a set in mutually spaced, generally parallel relationship independent from the container;
 transport means coupled to said supporting means for transporting controllably said supporting means between said unloading means and the processing station,a nd
 control means coupled to said transport means for causing said supporting means to support and transport simultaneously a plurality of wafers as a set unloaded from a transport container between said unloading means and the process container at the processing station.

21. The system of claim 20 wherein said unloading means further is for loading simultaneously a plurality of wafers as a set into a transport container.

22. A system for loading simultaneously a plurality of mutually spaced semiconductor wafers as a set into a transport container comprising:
 container and wafer supporting means positionable relative to a transport container structured to hold a set of a plurality of wafers for supporting the transport container and positionable relative to a plurality of wafers not loaded in a transport container for supporting simultaneously the plurality of wafers as a set in mutually spaced relationship, said container and wafer supporting means having both containerengaging and wafer-engaging portions separate from one another for separately supporting a transport container and a set of wafers;
 means for loading simultaneously a plurality of wafers maintained as a set in mutually spaced relationship into a transport container;
 transport means coupled to said supporting means for transporting controllably said supporting means; and
 control means coupled to said transport means for causing said supporting means to support and transport a transport container containing a set of a plurality of wafers to and from said means for loading.

23. The system of claim 22 wherein said loading means further is for unloading a plurality of wafers from a transport container.

24. In a system for transferring a plurality of generally planar and circular semiconductor wafers as a set between a transport container and a process container, which transport container supports wafers in mutually spaced and generally vertically oriented relationship, each of said wafers having a generally convex circular outer edge and the container having a passageway extending upwardly through it of a predetermined size, a wafer transferring apparatus comprising:
 supporting means positionable relative to a transport container containing a plurality of wafers for supporting the transport container;
 an upwardly extending stand sized to be freely received in the transport container passageway and having an upwardly facing surface structured to support simultaneously a plurality of wafers as a set in mutually spaced, generally vertically oriented relationship independent of said container, said upwardly facing surface having opposed side parts which engage the convex circular outer edges of wafer to provide said support independent of said container;
 a transport container landing fixed relative to the base of said stand for receiving a transport container lowered around said stand, said surface of said stand being disposed above said landing to hold wafers as a set out of a transport container disposed on said landing sufficiently to expose at leas one-half of the wafer outer edges; and
 controlled transport means coupled to said supporting means for lowering a transport container toward said landing with said stand received in the transport container passageway, thereby removing wafers from the transport container and supporting them on said stand independent of said container.

25. The system of claim 24 wherein said opposed side parts define generally concave circular surfaces complimentary to said convex circular outer edges of wafers.

26. In a system for transferring a plurality of semiconductor wafers as a set between a transport container at a delivery station and a process container at a wafer-processing station, support apparatus for supporting selectively a transport container or a set of wafers removed from a transport container comprising:
 container and wafer supporting means positionable relative to a transport container structured to hold a set of a plurality of wafers for supporting the transport container and positionable relative to a plurality of wafers unloaded from a transport container for supporting the set of wafers, said container and wafer supporting means having both container-engaging and wafer-engaging portions separate from one another for separately supporting a transport container and a set of wafers,
 said container and wafer supporting means including a pair of spaced-apart, facing jaws positionable in a first relative position for supporting the transport container and in a second relative position for supporting simultaneously a plurality of wafers as a set in mutually spaced relationship directly on said jaws without a transport container; and control means coupled to said container and wafer supporting means for moving said jaws between said first and second relative positions.

27. The apparatus of claim 26 wherein said jaws are adapted to be used with a transport container having a pair of ledges, each ledge extending from a side of the transport container opposite from the other ledge and each of said jaws includes a flange insertable under a corresponding ledge when positioned in said first position for vertically supporting the container.

28. The apparatus of claim 26 wherein said wafer supporting means is adapted to be used with a process container which supports wafers a predetermined distance apart, said wafer supporting means further including a generally vertically disposed mounting plate fixedly attached to one of said jaws for supporting said jaw with the thickness of said mounting plate being sufficiently thin to fit between adjacent wafers supported on the process container without contacting the wafers.

29. A system for transferring a plurality of semiconductor wafers between a transport container at a delivery station and a process container at a wafer-processing station comprising:

container and wafer supporting means positionable relative to a transport container containing a plurality of wafers for supporting the transport container and positionable relative to a plurality of wafers unloaded from a transport container for supporting the set of wafers;

said container and wafer supporting means including a pair of spaced-apart, facing jaws positionable in a first relative position for supporting a transport container and in a second relative position for supporting wafers directly on said jaws without a transport container;

unloading means for unloading a plurality of wafers from a transport container and for holding wafers unloaded from a transport container in generally vertically disposed planes spaced a predetermined distance apart;

transport means coupled to said supporting means for transporting controllably said supporting means to said unloading means; and control means coupled to said transport means for causing said supporting means to support and transport a transport container containing such a set of wafers between the deliver station and said unloading means for unloading said wafers;

each of said jaws including grooves facing generally upwardly and toward the other jaw and spaced apart at intervals corresponding to the spacing of wafers unloaded from a transport container held by said unloading means so that wafers supported by said jaws are received in said grooves.

30. Apparatus for manipulating alternatively a set of a plurality of mutually spaced semiconductor wafers and a transport container structured to support a set of a plurality of mutually spaced, separately supported wafers, comprising:

container and wafer supporting means positionable relative to such a transport container for supporting the transport container and positionable relative to such a set of wafers for supporting the set of wafers in mutually spaced relationship independent of a container, said container and wafer supporting means having both containerengaging and waferengaging portions separate from one another for separately supporting a transport container and a set of wafers;

transport means coupled to both said supporting means for transporting controllably said supporting means relative to a set of wafers disposed separately from a container and relative to a container; and control means coupled to said transport means for causing selectively and alternatively said supporting means to support and transport a transport container and to support and transport a set of wafers.

31. An apparatus according to claim 30 wherein said container and wafer supporting means include a pair of spaced-apart, facing jaws having said container-engaging portions positionable in a first relative position f or supporting a transport container and said wafer-engaging portions positionable in a second relative position for supporting simultaneously a plurality of mutually spaced wafers as a set directly on said jaws without a transport container.

32. An apparatus according to claim 31 wherein said jaws are adapted to be used with a transport container having a pair of ledges, each ledge extending from a side of the container opposite from the other ledge and each of said jaws includes a flange insertable under the ledges when positioned in said first position for supporting the container vertically.

33. An apparatus according to claim 31 wherein each jaw includes grooves facing generally upwardly and toward the other jaw and spaced apart at intervals corresponding to the spacing of wafers unloaded from at tranpsort container so that wafers supported by said jaws are received in said grooves.

34. An apparatus according to claim 30 wherein said supporting means supports wafers in the same relative orientations as a container supports such wafers

* * * * *